United States Patent
Matsui (10) Patent No.: US 6,822,898 B2
(45) Date of Patent: Nov. 23, 2004

(54) MULTI-VALUE NONVOLATILE SEMICONDUCTOR MEMORY DEVICE

(75) Inventor: Noriyuki Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/755,350

(22) Filed: Jan. 13, 2004

(65) Prior Publication Data

US 2004/0141372 A1 Jul. 22, 2004

Related U.S. Application Data

(63) Continuation of application No. 10/468,007, filed as application No. PCT/JP01/01272 on Feb. 21, 2001, now abandoned.

(51) Int. Cl.$^7$ .............................................. G11C 16/04
(52) U.S. Cl. ......................... 365/185.03; 365/185.24; 365/185.33
(58) Field of Search .................... 365/185.03, 185.18, 365/185.19, 185.2, 185.23, 185.24, 185.33

(56) References Cited

U.S. PATENT DOCUMENTS 5,889,716 A     3/1999    Hashimoto 6,477,090 B2 * 11/2002 Yamaki et al. ......... 365/189.09
6,643,193 B2 * 11/2003 Yamaki et al. ......... 365/189.09

FOREIGN PATENT DOCUMENTS

JP           10-214490        8/1998

* cited by examiner

*Primary Examiner*—Gene N. Auduong
(74) *Attorney, Agent, or Firm*—Arent Fox PLLC (57) ABSTRACT

A multi-value memory that has an improved data maintain period has been disclosed and, in a multi-value nonvolatile semiconductor memory device comprising a multi-value memory cell having a floating-gate and able to store at least three values, the threshold values of the multi-value memory cell are set from a state in which the threshold values designate at least two boundary values that identify at least three values to a state in which a fixed quantity of charges are injected into the floating gate in a data write operation, the read data is determined from the relationship between the threshold values of the multi-value memory cell and the (at least) two boundary values, and increments (margins) A1, A2 and A3 in the threshold value from threshold values VT1, VT2 and VT3, which are the lower limits of ranges, due to the injection of charges into the floating gate in the data write operation are set so that the increment is larger for data corresponding to a state in which a larger quantity of charges are injected.

5 Claims, 8 Drawing Sheets

$V = VS \exp(-t/CR)$

MULTI-VALUE NONVOLATILE SEMICONDUCTOR MEMORY DEVICE

This application is a continuation application of U.S. patent application Ser. No. 10/468,007, filed on Aug. 21, 2003 now abandoned, which claims the benefit of International Application No. PCT/JP01/01272, filed on Feb. 21, 2001, which International Application was published by the International Bureau, in Japanese, on Aug. 29, 2002. The disclosures of the prior applications are hereby incorporated herein in their entirety by reference.

FIELD OF THE INVENTION

The present invention relates to a nonvolatile semiconductor memory device such as a flash memory. More particularly, the present invention relates to a multi-value nonvolatile semiconductor memory device which stores multi-value data in a memory cell.

BACKGROUND OF THE INVENTION

Nonvolatile semiconductor memory devices, such as EPROM's, EEPROM's and flash memories, having a floating gate are widely used. Although description is given below using a flash memory as an example, the present invention can be applied to any nonvolatile semiconductor memory device, not limited to this, as long as it has a floating gate.

In a conventional semiconductor memory device, it is usual for each memory cell to store one of two values, that is, either "0" or "1", but in recent nonvolatile semiconductor memory devices, the trend is for each memory cell to store one of more than two values, for example, four values, that is, "00", "01", "10", or "11", so that the memory capacity can be increased without an increase in the number of memory cells. The present invention relates to such a multi-value nonvolatile semiconductor memory device that stores one of multiple values in each memory cell and that can be applied to any case where one of an arbitrary number of values is stored, but description is given below using a case where one of four values is stored as an example. In the description below, a multi-value nonvolatile semiconductor memory device is simply referred to as a multi-value memory.

A multi-value memory has a floating gate and the gate voltage (voltage of the control gate) at which a memory cell (transistor) is brought into the ON-state is changed by changing the quantity of charges (electrons) to be injected into the floating gate. A gate voltage at which a memory cell is brought into the ON-state is referred to as a threshold value here. In a multi-value memory, multiple boundary values are specified for a threshold value and a data value is assigned according to which area the threshold value belongs to, among the multiple areas specified by these boundary values. For example, in a case where the threshold value changes from 0V to 5V and four values are stored, first a boundary value of 2.5V, which is a half of 5V, is set so that the area is divided into two equal areas, and then two boundary values of 1.25V and 3.75V, which are the middle values in the divided two areas, respectively, are set so that each divided area is further divided into two areas, and thus the original area is divided into four equal areas. Then, for example, when the threshold value of a transistor is less than 1.25V, data "00" is assigned, and when between 1.25V and 2.5V, data "01", when between 2.5V and 3.75V, data "10", and when greater than 3.75V, data "11" is assigned. In this manner, each memory cell stores one of four values (that is, two bits). Generally, boundary values are set at equal intervals in a multi-value memory, as described above, because the algorithm of the write operation is simple.

Figure 1:
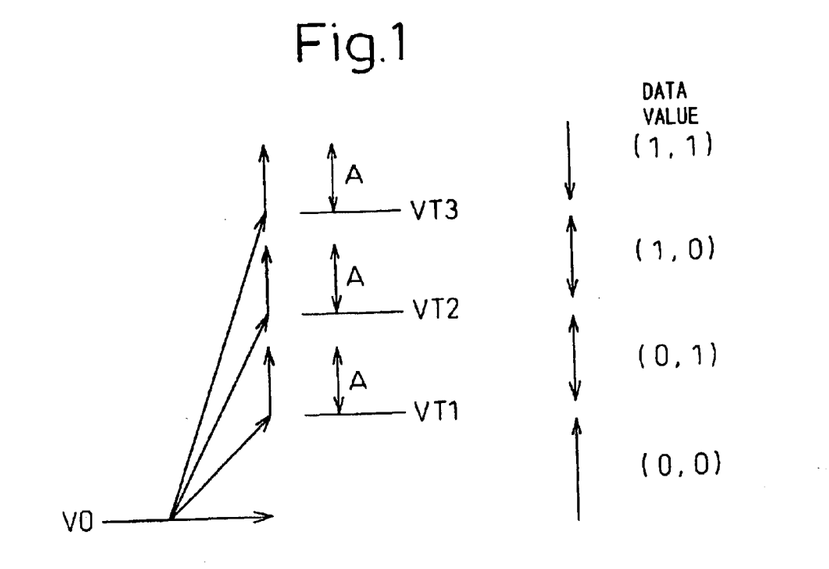
FIG. 1 is a diagram that shows a relationship between the threshold value and the margin of a conventional multi-value nonvolatile memory.

FIG. 1 is a diagram that illustrates setting of boundary values and margins in a conventional multi-value memory. As described above, boundary values VT1, VT2 and VT3 are set at equal intervals and a data value is assigned to each of the four areas, respectively, which are divided by the boundary values VT1, VT2 and VT3.

Before data is written, an erase operation is performed that brings about a state in which the threshold value is V0 by removing charges once from the floating gate. V0 is a value far smaller than the lowest boundary value VT1 and is about 0V in the above-mentioned case. After the erase operation the write operation is performed, but when the write data is "00", a write operation is not performed. This means that the threshold value of data "00" is V0, which corresponds to an erased state. When writing other data, the threshold value is detected after performing the write operation in which charges are injected into the floating gate little by little, and whether the lower limit threshold value of the write data is exceeded is checked. This action is repeated until the lower limit threshold value is exceeded, and when the lower limit threshold value is exceeded, charges are injected into the floating gate under a fixed condition so that the threshold value is increased by A. The threshold value A to be increased is determined so that the upper limit boundary value is not exceeded with variations in elements being taken into consideration. The threshold value A to be increased is the same regardless of the boundary values.

In the write operation described above, if the quantity of charges to be injected into the floating gate in one write operation is large, an error is produced, the maximum of which corresponds to the increment in the threshold value from the lower limit threshold value in one write operation, when it is detected that the threshold value is exceeded and, therefore, the smaller the quantity of charges to be injected into the floating gate in one write operation, the smaller the error. However, there occurs a problem that if the quantity of charges to be injected in one write operation is small, the number of times of repetition increases and the period of time required for the write operation is lengthened accordingly. Therefore, a method is adopted, in which as large a quantity of charge as possible but a quantity that ensures that the lower limit in the target range is not exceeded is injected the first time, then the above-mentioned operation is repeated while a small quantity of charges are injected each time.

Whether the threshold value exceeds the lower limit boundary value is detected by applying the voltage of the lower limit boundary value to the gate and judging whether the transistor is brought into the ON-state.

There are some cases where whether the threshold value exceeds the value that is the lower limit boundary value in the target range added by A is detected, instead of increasing the threshold value by A, by performing a fixed write operation after the threshold value exceeds the lower limit boundary value in the target range.

When the stored multi-value data is read, first, the boundary value VT2 is applied to the gate and whether the transistor is brought into the ON-state is detected. If it is brought into the ON-state, the boundary value VT1 is applied to the gate and whether the transistor is brought into the ON-state is detected, and if it is brought into the ON-state, the data is judged to be "00", and if it is brought into the OFF-state, the data is judged to be "01". If the application of VT2 brings the transistor into the OFF-state, then whether the application of the boundary value VT3 to the gate brings the transistor into the ON-state is detected, and if it is brought into the ON-state, the data is judged to be "10" and if it is brought into the OFF-state, the data is judged to be "11". In this case, as the voltage of the boundary value is applied twice to the gate, the read time is lengthened. Therefore, there are some cases where the current when a fixed voltage is applied is detected as a threshold value and it is compared with the three boundary values in parallel. The present invention can be applied to any one of the cases.

The charges injected into the floating gate eventually leak, although gradually. When it is assumed that the leak current is i, the quantity of charges within the floating gate is Q, the capacitance of the floating gate is C, and the voltage of the floating gate is V, they are expressed by the following relationship $$i = -dQ/dt = -C \times dV/dt$$

The voltage V of the floating gate is proportional to the threshold voltage. On the other hand, when the leak resistance is assumed to be R, then i=V/R, and when this is substituted into the above-mentioned expression, the following expression is obtained $$V = -CR \times dV/dt$$

Therefore, when the initial threshold value is assumed to be VS, the following expression is obtained $$V = VS \exp(-t/CR)$$

Figure 2:
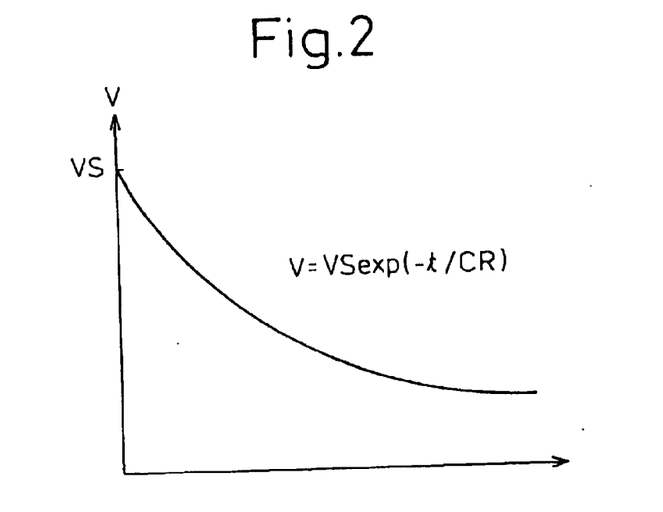
FIG. 2 is a diagram that shows how the threshold value decreases through the leakage of charges from the floating gate of a nonvolatile memory.

From this expression, it is found that the threshold value decreases while describing a curve of an exponential function, as shown in FIG. 2.

As shown in FIG. 1, in a conventional multi-value memory, the boundary values of the threshold value are spaced at identical intervals and at the same time, the threshold value A is the same, which is an increment from the lower limit boundary value in the write operation. The threshold value A that is an increment from the lower limit boundary value corresponds to a margin for leakage. The threshold value decreases as time elapses because of the leakage, and when it decreases below the lower limit of the range, that is, when it decreases by more than the margin, the range may be wrongly judged to be a different range.

Figure 3:
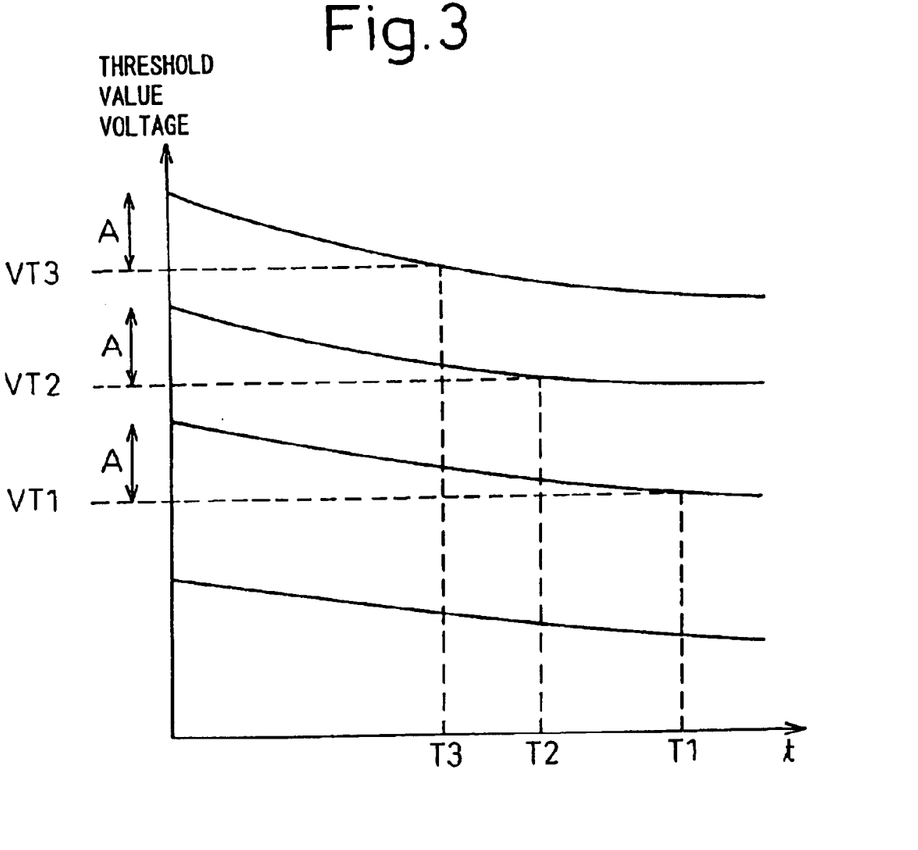
FIG. 3 is a diagram that illustrates data maintain periods in the case of the conventional threshold values and margins.

FIG. 3 is a diagram that shows the relationship between the margin and the leakage. As shown in FIG. 3, when data "01", "10" and "11" are written, charges are injected so that the threshold values are equal to the boundary values VT1, VT2 and VT3 added by the margin A, respectively. As described above, the threshold value decreases as time elapses describing a curve of an exponential function, therefore, the amount of decrease is larger for the data for which the quantity of injected charges is larger, and the period of time for the threshold value to decrease by the amount A is the shortest for the data "11", that is, a period of time T3, a period of time T2 for the data "10", is longer and a period of time T1 for the data "01" is the longest. In the case of "00", a wrong judgment is unlikely to occur because there is no lower limit boundary value.

For a multi-value memory, a maintain period of the written data is defined and it is attempted to discover an element whose leak resistance is small in a test such as an accelerated test. However, it is difficult to discover an element, the maintain period of which is a year or longer, in the accelerated test and there occurs a problem that the ability to maintain data during the defined period is insufficient when it is put to practical use, even though it has passed the accelerated test.

SUMMARY OF THE INVENTION

The present invention has been developed to solve the above-mentioned problems and the object of the present invention is to realize a multi-value memory that has improved the data maintain period.

Figure 4:
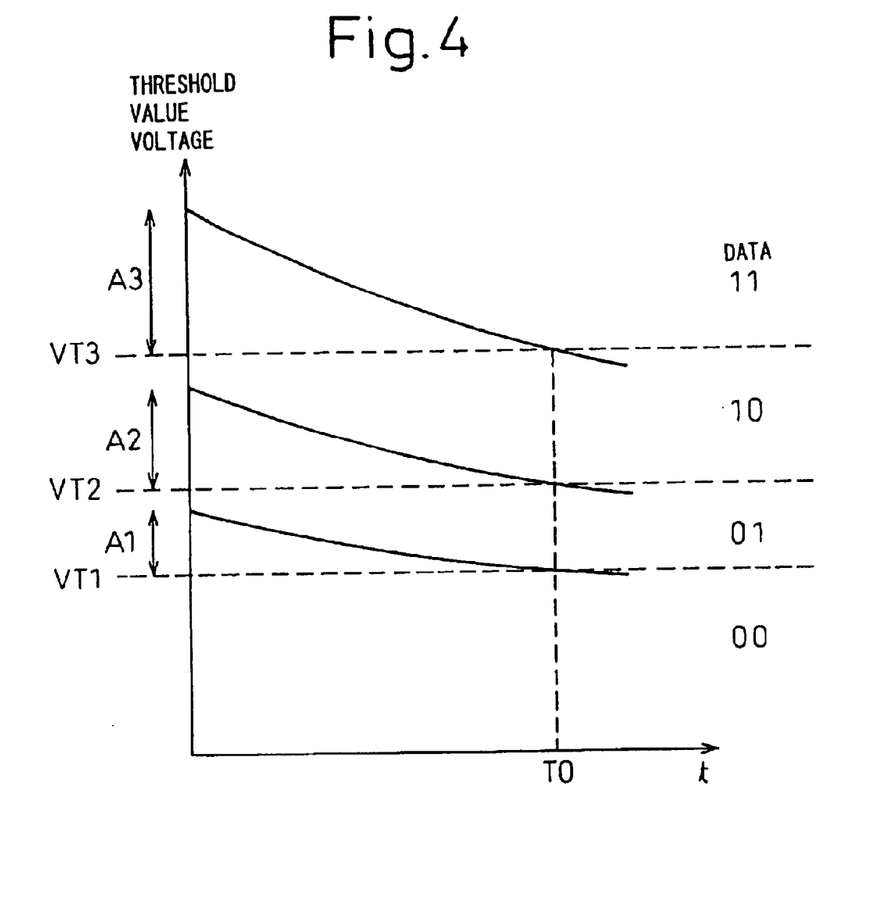
FIG. 4 is a diagram that illustrates the principle of the present invention and at the same time illustrates the data maintain periods in the case of the threshold values and the margins according to the present invention.

FIG. 4 is a diagram that illustrates the principle of the present invention.

In order to realize the above-mentioned object, the multi-value nonvolatile semiconductor memory device according to the present invention is characterized in that increments A1, A2 and A3 in the threshold, which correspond to the quantity of charges injected into the floating gate and which are added to the lower limit threshold values VT1, VT2 and VT3 of each range, respectively, in the data write operation, are set so as to be larger for the data corresponding to a state in which a larger quantity of charges are injected.

As described in FIG. 3, the larger the quantity of charge injected into the floating gate, the larger the amount of leakage and the larger the amount of decrease in the threshold value when the elapsed time is the same. Therefore, when the margin is the same, the period of time required for the threshold value to decrease by more than the margin is shorter for the data corresponding to a state in which a larger quantity of charges are injected. As the data maintain period of a semiconductor memory device is defined with the worst case being taken into consideration, even though the data maintain period of the data corresponding to a state in which a small quantity of charges are injected is long, the data maintain period in this case is defined by a value corresponding to a case where data, corresponding to a state in which a large quantity of charge are injected, is stored.

According to the present invention, the margins A1, A2 and A3 are set so as to be larger for the data corresponding to a state in which a larger quantity of charges are injected, as shown in FIG. 4. Therefore, the data maintain period in a case where data corresponding to a state in which a larger quantity of charges are injected is lengthened and the data maintain period of a semiconductor memory device can be lengthened. Ideally, if the periods of time required for the threshold values to decrease through leakage by the amounts corresponding to margins A1, A2 and A3, respectively, are set so as to be the same using the decay curves of the threshold value, the data maintain period of the semiconductor memory device can be lengthened further.

As described above, the margin is set so that the upper limit of each range is not exceeded, with the variations in elements or the like being taken into account. In order to extend a margin when writing data corresponding to a state in which a large quantity of charges are injected, it is necessary to extend the range corresponding to each data so that the larger the quantity of injected charges, the wider the range. Therefore, when each multi-value memory cell stores at least four values and there are at least three boundary values, the interval between boundary values is made wider for a range of threshold value of data corresponding to a state in which a larger quantity of charges are injected.

To make the margins different from each other, the write operation is performed under the same condition but the period of time for the write operation is selected in accordance with the write data, when charges are further injected into the floating gate in a state in which the threshold value indicates the lower limit of the range. In the case where the injection of charges into the floating gate is performed by the application of write pulse, the number of pulses is made to remain unchanged but the width of pulse is selected in accordance with the write data or the same pulse is used but the number of pulses is selected in accordance with the write data, when charges are further injected into the floating gate in a state in which the threshold value indicates the lower limit of the range.

DETAILED DESCRIPTION OF THE PREFERRED EMBODIMENTS

Figure 5:
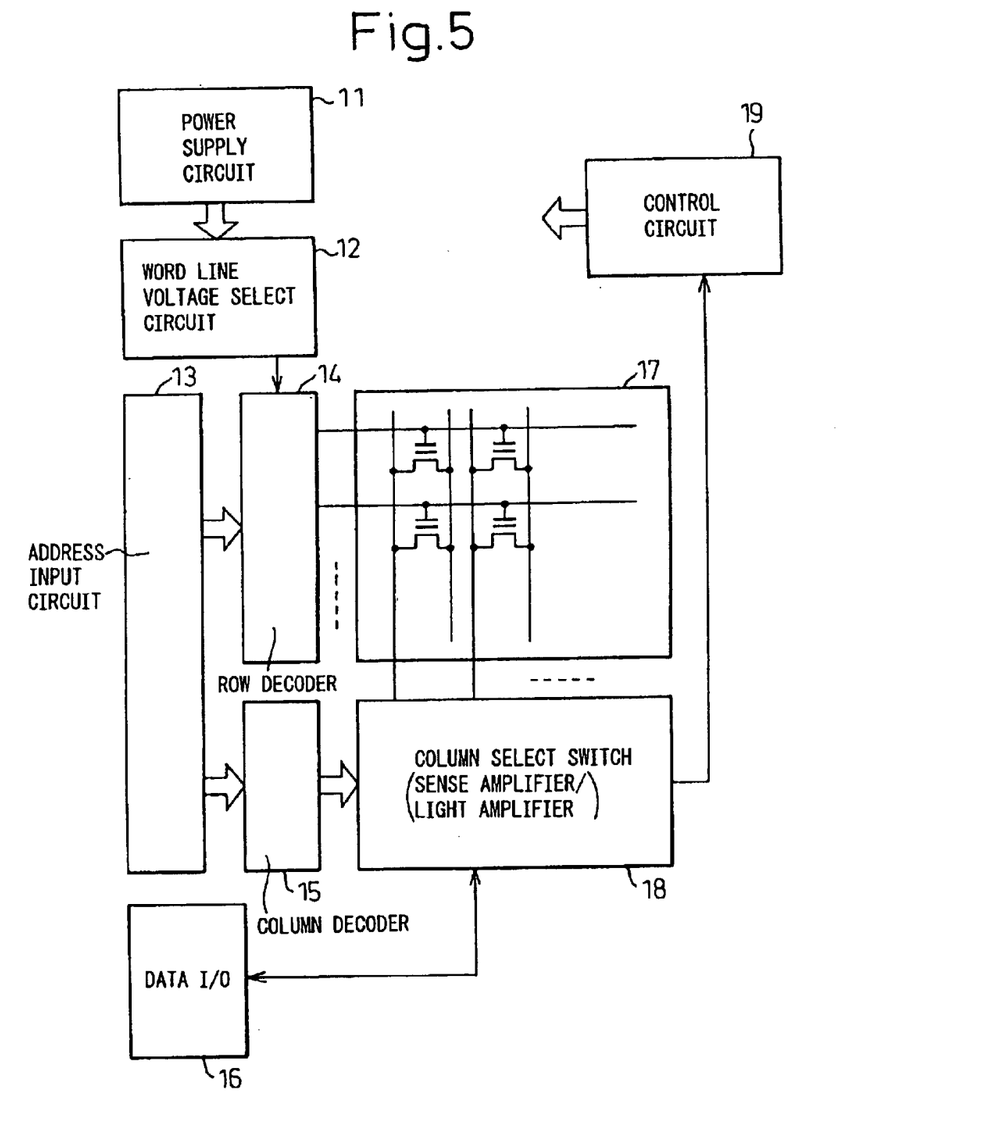
FIG. 5 is a diagram that shows the general configuration of a flash memory in a first embodiment of the present invention.

FIG. 5 is a diagram that shows the general configuration of the flash memory in the first embodiment of the present invention.

As shown in FIG. 5, the flash memory in the present embodiment has a configuration similar to that of a conventional multi-value flash memory. A power supply circuit 11 is a circuit that generates various voltages to be used internally. A word line voltage select circuit 12 selects a voltage generated in the power supply circuit 11 according to the operation and supplies it to a row decoder 14. An address input circuit 13 receives an address signal supplied from the outside and supplies it to the row decoder 14 and a column decoder 15. A data I/O 16 is a data input/output circuit. A memory cell array 17 has a plurality of word lines and a plurality of bit lines arranged so as to be differ in direction by 90 degrees from each other, and transistors arranged at the crossings, and each transistor corresponds to a memory cell. Each transistor has a floating gate, the gate is connected to the word line from the row decoder 14, the drain is connected to the bit line from a column select switch 18, and the source is connected to a common source line. The column select switch 18 has a switch that selects a bit line to be connected to the data I/O 16 according to the signal from the column decoder 15 and a sense amplifier/light amplifier. A control circuit 19 is a section that generates a control signal for each part.

Figure 6A:
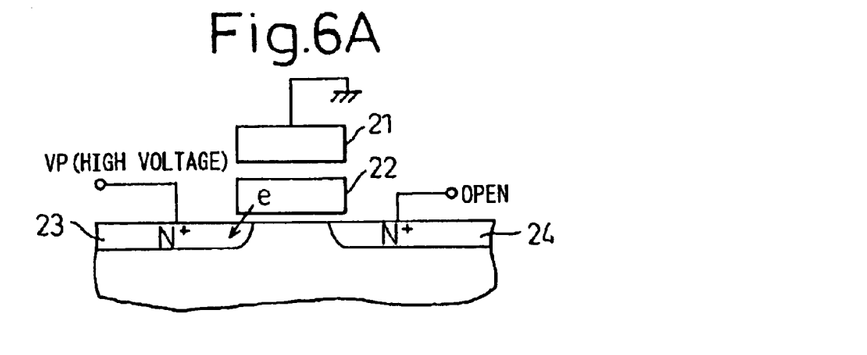
FIGS. 6A to 6C are diagrams that illustrate the erase, write and read operations in the flash memory.
Figure 6B:
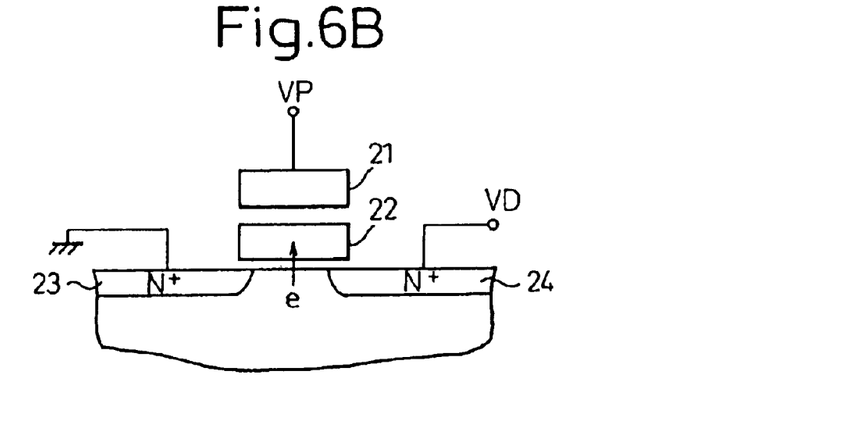
Figure 6C:
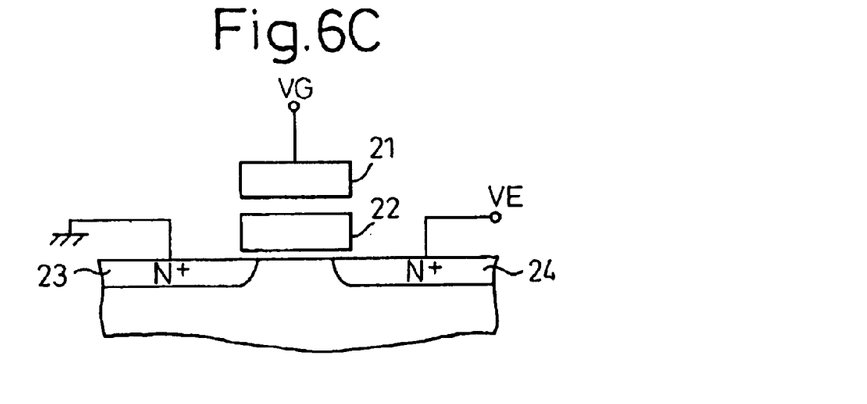

FIG. 6A to FIG. 6C are diagrams that illustrate the erase, write and read operations in the flash memory. As shown in FIG. 6A, in the erase operation, a high voltage VP is applied to a source 23, a gate 21 is grounded, a drain 24 is opened, electrons are pulled out from a floating gate 22, and a state is brought about in which the threshold value corresponding to data "00" is small. As shown in FIG. 6B, in the write operation, the high voltage VP is applied to the gate 21, the source 23 is grounded, a voltage VD is applied to the drain 24, electrons are injected into the floating gate 22 from the channel, and the threshold value is made to be one corresponding to the data. As shown in FIG. 6C, in the read operation, a voltage VG is applied to the gate 21, the source 23 is grounded, a voltage VE is applied to the drain 24, and whether the transistor is brought into the ON-state is detected. Depending on the quantity of charges (electrons) injected into the floating gate 22 in the write operation, the gate voltage VG at which the transistor is brought into the ON-state differs. While the gate voltage VG is being changed, the gate voltage VG (threshold value) at which the transistor is brought into the ON-state is detected, which range the value belongs in is judged, and the data value is determined. The configuration described above is the same as that of a conventional multi-value flash memory, therefore, no further description is given here.

The present invention differs from a conventional case in that the boundary values of the threshold value ranges corresponding to the data "00", "01", "10" and "11" are not equally spaced, as shown in FIG. 4, but the distance between VT3, which is the boundary value between the data "11" and "10", and VT2, which is the boundary value between the data "10" and "01", is wider than the distance between the boundary value VT2 and VT1, which is the boundary value between the data "01" and "00", and that when the data is written, the margins, by which the threshold is increased after the lower limit boundary value of each data range is reached, are set so that the margin A1 for the data "10" is the smallest, the margin A2 for the data "10" is larger than the margin A1, and the margin A3 for the data "11" is the largest. Therefore, the power supply circuit 11 is configured so as to generate voltages corresponding to the above-mentioned boundary values VT1, VT2 and VT3, respectively.

Figure 7:
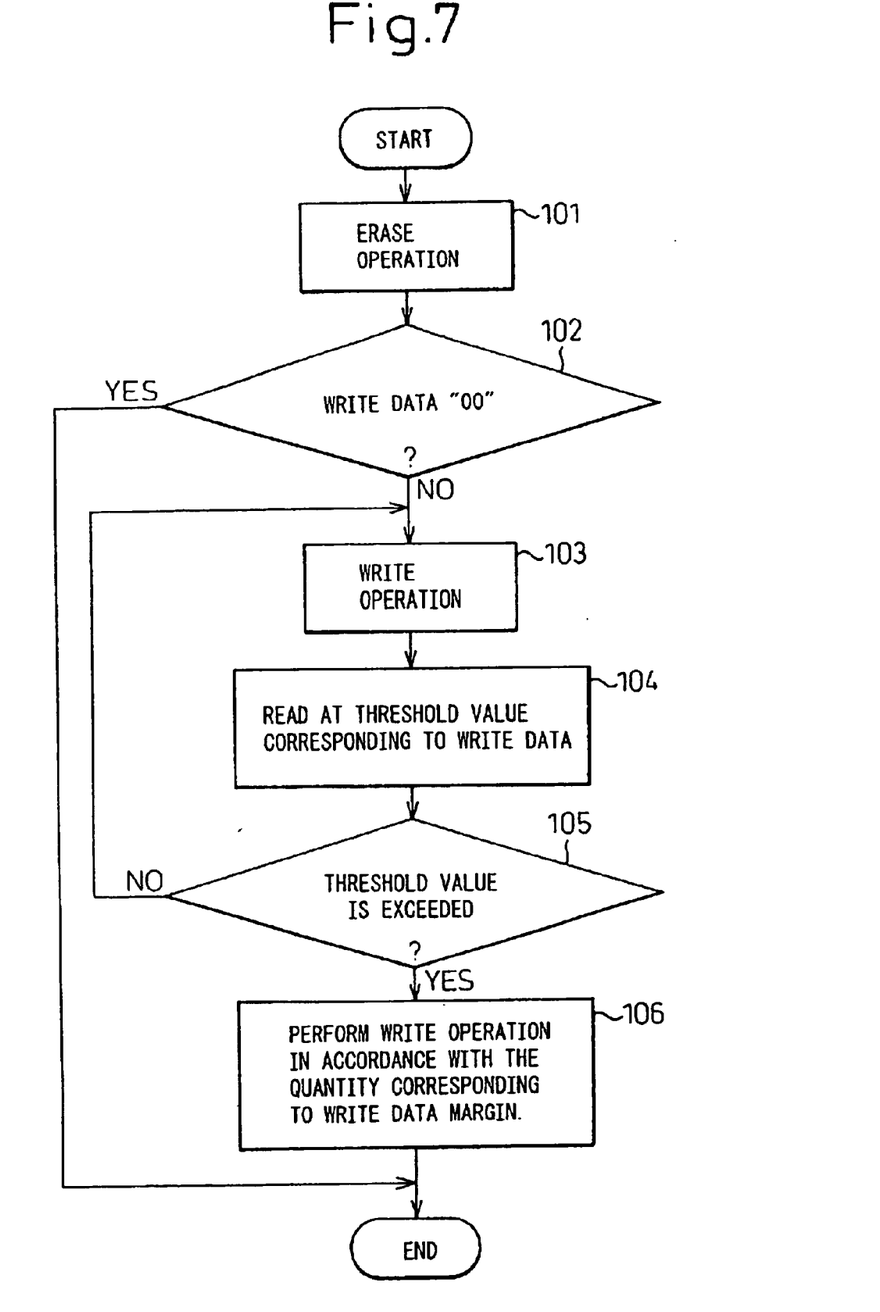
FIG. 7 is a flow chart that shows the write operation in the first embodiment.

FIG. 7 is a flow chart that shows the write operation in the first embodiment. By reference to FIG. 7, the write operation in the first embodiment is described below.

Before the write operation is performed, the erase operation is performed in step 101. Due to this, all the memory cells (transistors) are brought into a state corresponding to the data "00", that is, a state in which the threshold value is sufficiently smaller than VT1.

In step 102, whether the write data is "00" is judged. When the write data is "00", the operation is terminated because it is not necessary to perform the write operation. When the write data is not "00", the write operation is performed in step 103 as shown in FIG. 6B. At this time, the quantity of charges to be injected into the floating gate in one write operation is made to be sufficiently small. Next, in step 104, the read operation is performed by applying the threshold value corresponding to the write data to the gate. In step 105, whether the transistor has been brought into the ON-state, based on the result of the read operation, is judged and when it is not in the ON-state, this means that the target threshold value is not reached, therefore, steps 103 to 105 are repeated. When the transistor is judged to have been brought into the ON-state, this means that the threshold exceeds the target boundary value to some extent, that is, the threshold value is almost equal to the lower limit of the target range, therefore, the next step will be step 106. In this case, the difference between the actual threshold value and the lower limit is, at the maximum, the amount of change in threshold value in one write operation in step 103, and it is necessary to reduce the quantity of charges to be injected into the floating gate in one write operation in step 103 in order to reduce the difference between the actual threshold value and the lower limit.

Figure 8A:
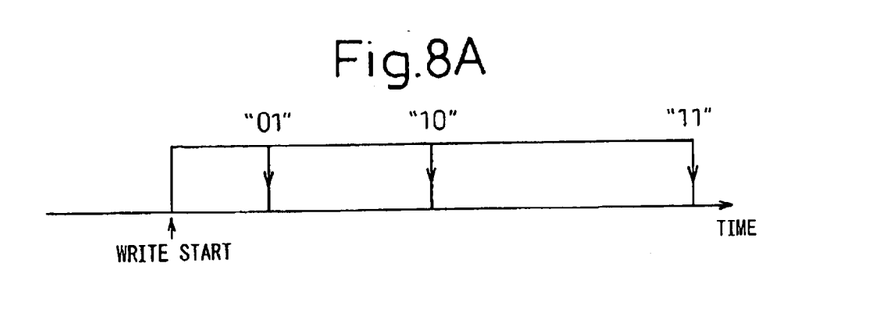
FIGS. 8A to 8C are diagrams that illustrate methods for changing the margin in the write operation.
Figure 8B:
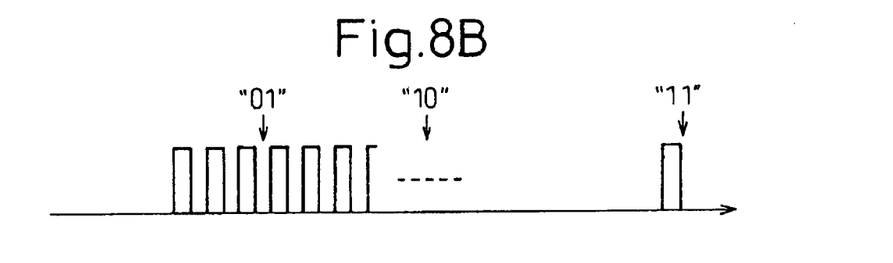
Figure 8C:
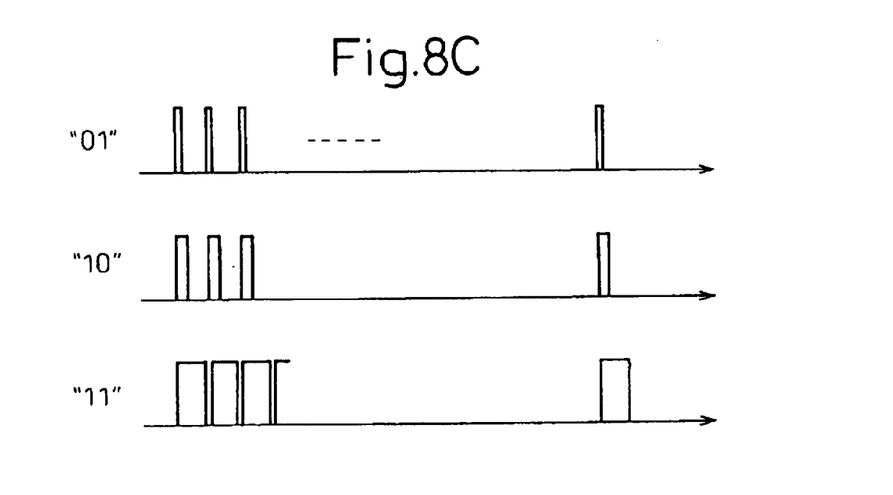

In step 106, the write operation is performed in such a way that the threshold value increases by the amount corresponding to the margin of the write data. By reference to FIG. 8, how the write operation is performed, so that the threshold value increases by the amount corresponding to the margin in the present embodiment, is described concretely below.

Generally, when the voltages (VP and VD in FIG. 6B) to be applied to each part in the write operation are the same, the quantity of charges to be injected into the floating gate increase in proportion to the period of time of the write operation state. Therefore, the period of time of the write operation state is lengthened for the write data corresponding to a larger quantity of charges, as shown in FIG. 8A.

In addition, there are some cases where the write operation is performed by applying a pulse-shaped voltage VP to the gate. In this case, if the width of the pulse is constant, the quality of charges to be injected into the floating gate increase as the number of pulses increases. Therefore, the number of write pulses is specified according to the write data as shown in FIG. 8B. Moreover, if the width of the pulse is widened, the quantity of charges to be injected into the floating gate increases accordingly. Therefore, the width of the write pulse is set according to the write data, while the number of pulses is being kept constant.

In the manner described above, the threshold values having a margin corresponding to the write data can be set.

In the operation in the flow chart in FIG. 7, the difference between the actual threshold value and the lower limit when the threshold value exceeds the lower limit of the target range in step 105 is, at the maximum, the amount of change in the threshold value due to one write operation in step 103, and in order to reduce the difference between the actual threshold value and the lower limit, it is necessary to reduce the quantity of charges to be injected in one write operation in step 103. However, if the quantity of charges to be injected into the floating gate in one write operation is small, a problem occurs that the number of times of repetition of steps 103 to 105 increases and the period of time of the write operation is lengthened. In the second embodiment, this problem is solved and it is designed so that a write operation with high accuracy can be performed in a short time.

Figure 9:
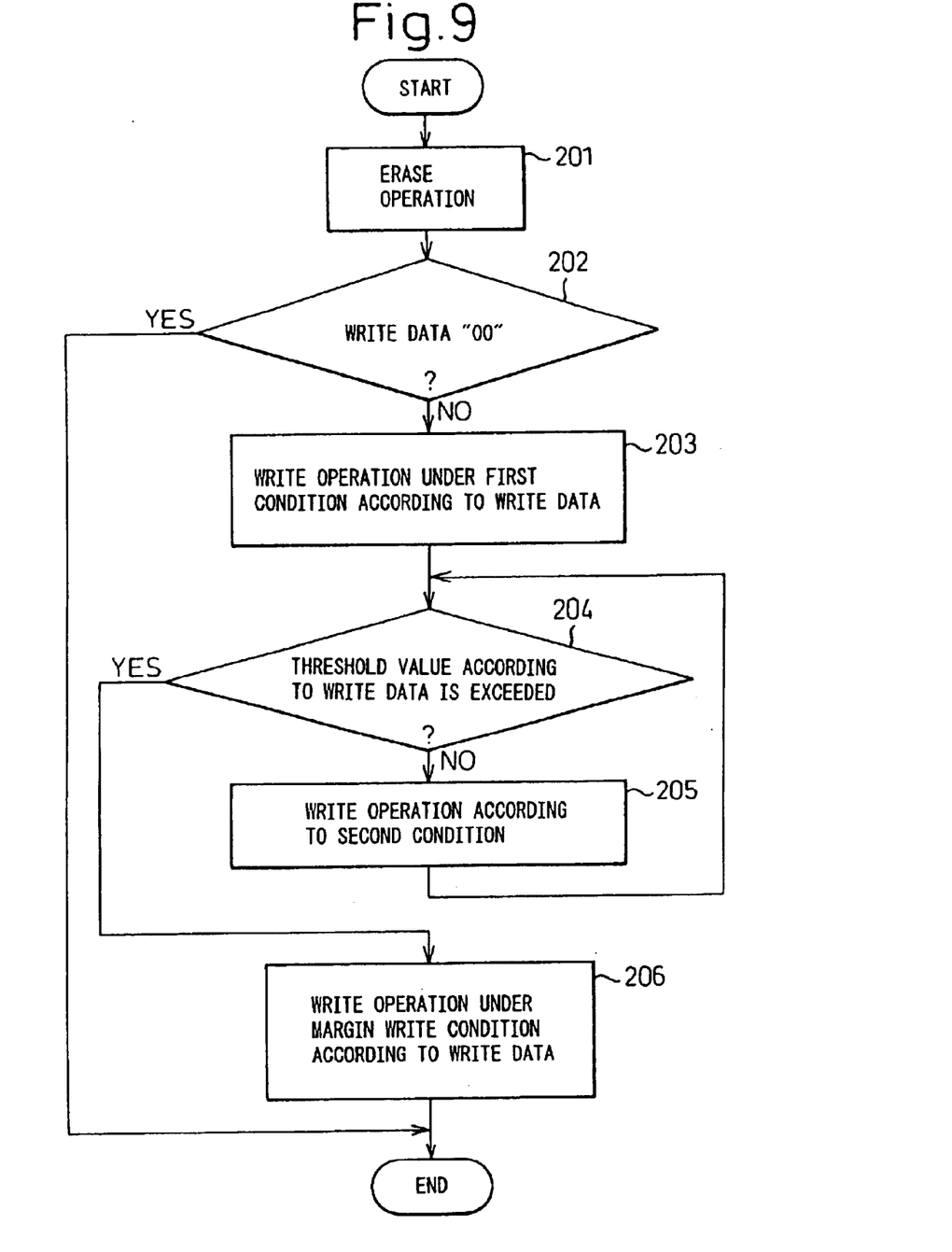
FIG. 9 is a flow chart that shows the write operation in a second embodiment of the present invention.

FIG. 9 is a flow chart that shows the write operation of the multi-value flash memory in the second embodiment of the present invention. The configuration of the multi-value flash memory in the second embodiment is the same as that in the first embodiment. The write operation in the second embodiment differs from that in the first embodiment in steps 203 to 205. In step 203, the write operation is performed after setting a write condition (first write condition) according to the write data. For example, the write operation is performed for each data under such a condition that the lower limit threshold value is unlikely to be exceeded but the threshold value increases nearly to the lower limit. In other words, the write operation is performed under the condition that the threshold value increases nearly to VT1 for the data "01", nearly to VT2 for the data "10", and nearly to VT3 for the data "11". In this case also, a condition such as that the period of time for the write operation is lengthened according to the larger increment in the threshold value is set.

In step 204, whether the lower limit of the write data is exceeded is judged, and if so, the next step will be step 206.

As described above, the first condition in step 203 is set so that the threshold value does not exceed the lower limit, therefore, step 204 does not have to be performed immediately after step 203, but actually it is performed for confirmation.

In step 205, the write operation is performed under a second condition that the increment in the threshold value in one write operation is sufficiently small, then the threshold value is judged in step 204 and steps 205 and 206 are repeated until the threshold value exceeds the lower limit. As the increment in the threshold value in one write operation in step 205 is small, it is possible to reduce the difference between the actual threshold value and the lower limit when the threshold is judged to have exceeded the lower limit in step 204. Moreover, as the threshold value has increased nearly to the lower limit in step 203 before step 205 is performed, the number of times of repetition can be reduced and the period of time for the write operation can be shortened.

Step 206 is the same as that in the first embodiment.

The embodiments of the present invention are described as above, but there can be various modifications of the present invention. For example, the embodiments are described using the case where the present invention is applied to the multi-value flash memory, but it is also possible to apply the present invention to a nonvolatile semiconductor memory device, such as EPROM and EEPROM, that has a floating gate.

Moreover, the margin according to the write data is written after the write operation is performed until the threshold value reaches the lower limit in the embodiments, but it is also possible to generate a voltage corresponding to the sum of the lower limit of the target range and the margin, apply the voltage to the gate, and judge whether the voltage corresponding to the sum of the lower limit and the margin is exceeded.

INDUSTRIAL AVAILABILITY

The present invention improves the reliability of the multi-value semiconductor memory. The present invention can suppress the occurrence of the problem that the maintained data changes after a long period of time elapses, which has not been discovered in an acceleration test, and is highly effective in improving the reliability after the long-term storage, the management of which has been a challenging problem.

I claim:

1. A multi-value nonvolatile semiconductor memory device comprising a multi-value memory cell having a floating gate and able to store at least three values, wherein the threshold values of the multi-value memory cell are set from a state in which the threshold values designate at least two boundary values that identify at least three values to a state in which the threshold values are increased by the injection of a predetermined quantity of charges into the floating gate in a data write operation, wherein the read data is determined from the relationship between the threshold values of the multi-value memory cell and the at least two boundary values, and wherein the increment in the threshold value from the state in which the threshold values of the multi-value memory cell designate the at least two boundary values to the state in which the threshold values are increased by the injection of charges into the floating gate in the data write operation is larger for data corresponding to a state in which a larger quantity of charges are injected.

2. A multi-value nonvolatile semiconductor memory device, as set forth in claim 1,
wherein the number of the boundary values is at least three or more so that each multi-memory cell can store at least four values, and
wherein the distance between the neighboring boundary values of the (at least) three boundary values is wider for the neighboring boundary values that identify data corresponding to a state in which a larger quantity of charges are injected.

3. A multi-value nonvolatile semiconductor memory device, as set forth in claim 1 or 2,
wherein when charges are injected into the floating gate in the state in which the threshold values of the multi-value memory cell designate the (at least) two boundary values, a write operation is performed under an identical condition and the period of time for the write operation is selected in accordance with the write data.

4. A multi-value nonvolatile semiconductor memory device, as set forth in claim 1 or 2,
wherein the injection of charges into the floating gate is performed by applying a write pulse to the multi-value memory cell, and
wherein when charges are injected into the floating gate in the state in which the threshold values of the multi-value memory cell designate the (at least) two boundary values, the number of pulses is made to remain the same and the width of pulse is changed in accordance with the write data.

5. A multi-value nonvolatile semiconductor memory device, as set forth in claim 1 or 2,
wherein the injection of charges into the floating gate is performed by applying a write pulse to the multi-value memory cell, and
wherein, when charges are injected into the floating gate in the state in which the threshold values of the multi-value memory cell designate the (at least) two boundary values, the same pulse is used and the number of pulses is changed in accordance with the write data.

* * * * *